United States Patent
Balantrapu et al.

(10) Patent No.: US 9,598,590 B2
(45) Date of Patent: *Mar. 21, 2017

(54) HOT MELT COMPOSITIONS WITH IMPROVED ETCH RESISTANCE

(71) Applicant: Rohm and Haas Electronic Materials LLC, Marlborough, MA (US)

(72) Inventors: Krishna Balantrapu, Cambridge, MA (US); Robert K. Barr, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/931,143

(22) Filed: Nov. 3, 2015

(65) Prior Publication Data

US 2016/0066430 A1    Mar. 3, 2016

Related U.S. Application Data

(62) Division of application No. 13/971,537, filed on Aug. 20, 2013, now Pat. No. 9,453,139.

(51) Int. Cl.

| | |
|---|---|
| *C08J 3/28* | (2006.01) |
| *C09D 11/34* | (2014.01) |
| *H05K 3/18* | (2006.01) |
| *H05K 3/00* | (2006.01) |
| *C09D 11/12* | (2006.01) |
| *H05K 3/06* | (2006.01) |
| *C09D 11/101* | (2014.01) |
| *C09D 11/38* | (2014.01) |
| *C09D 133/08* | (2006.01) |
| *C09D 133/10* | (2006.01) |
| *C09D 135/02* | (2006.01) |
| *C09D 11/107* | (2014.01) |

(52) U.S. Cl.
CPC .......... *C09D 11/34* (2013.01); *C09D 11/101* (2013.01); *C09D 11/107* (2013.01); *C09D 11/12* (2013.01); *C09D 11/38* (2013.01); *C09D 133/08* (2013.01); *C09D 133/10* (2013.01); *C09D 135/02* (2013.01); *H05K 3/002* (2013.01); *H05K 3/0076* (2013.01); *H05K 3/0079* (2013.01); *H05K 3/061* (2013.01); *H05K 3/181* (2013.01); *H05K 3/0023* (2013.01); *H05K 3/0082* (2013.01); *H05K 3/18* (2013.01); *H05K 2203/013* (2013.01); *H05K 2203/0545* (2013.01); *H05K 2203/0769* (2013.01); *H05K 2203/0793* (2013.01); *H05K 2203/122* (2013.01)

(58) Field of Classification Search
CPC ......... C09D 11/00; C09D 11/12; C09D 11/34; C09D 11/101; C09D 11/107; C09D 133/08; C09D 133/10; C09D 135/02; H05K 3/002; H05K 3/0023; H05K 3/0076; H05K 3/0079; H05K 3/0082; H05K 3/61; H05K 3/18; H05K 3/181; H05K 2203/013; H05K 2203/0545; H05K 2203/0769; H05K 2203/0793; H05K 2203/122

See application file for complete search history.

(56) References Cited

U.S. PATENT DOCUMENTS

| | | |
|---|---|---|
| 3,964,915 A | 6/1976 | Doenges et al. |
| 4,013,607 A | 3/1977 | Dwyer et al. |
| 4,087,727 A | 5/1978 | Horiuchi et al. |
| 4,113,525 A | 9/1978 | Stayner et al. |
| 4,122,032 A | 10/1978 | Hollerich |
| 4,177,076 A | 12/1979 | Sato |
| 4,499,163 A | 2/1985 | Ishimaru et al. |
| 5,068,263 A | 11/1991 | Noguchi |
| 5,217,798 A | 6/1993 | Brady et al. |
| 5,507,864 A | 4/1996 | Jaeger et al. |
| 5,852,080 A | 12/1998 | Philbin et al. |
| 5,922,114 A | 7/1999 | Sawada |
| 5,954,865 A | 9/1999 | Sawada |
| 6,610,869 B1 | 8/2003 | Huebner et al. |
| 6,623,907 B2 | 9/2003 | Numata et al. |
| 6,742,884 B2 | 6/2004 | Wong et al. |
| 6,764,710 B2 | 7/2004 | Merdan et al. |
| 6,841,589 B2 | 1/2005 | Schmidt et al. |
| 6,872,320 B2 | 3/2005 | Wong et al. |
| 6,890,982 B2 | 5/2005 | Borsinger et al. |

(Continued)

FOREIGN PATENT DOCUMENTS

| | | |
|---|---|---|
| CA | 1298754 | 4/1992 |
| EP | 676454 | 4/1995 |

(Continued)

OTHER PUBLICATIONS

Technical Data Sheet for Palmitic Acid from Parchem: Fine and Specialty Chemicals. (no date). Retrieved online. Retrieved on Nov. 14, 2015 from ,URL://http:www.parchem.com/Palmitic-Acid-getpdf-000369.aspx>.

Technical Disclosrue for Monton Wax from Hegring-Montgomery, Inc. (no date). Retrieved online. Retrieved on Nov. 14, 2015 from ,URL://http:www.gehring-montgomery.com/...Waxes/.../TERMontanWaxType6715>.

White, Prof. Robert, "Aluminum Etch", Standard Operating Procedures of Tufts emergency Medical Services, Feb. 2, 2009, pp. 1-3.

Montan Acid Waxes, Strohmeyer & Arpe Company Product Specifications Nov. 3, 2015 from http://www.strohmeyer.com/acidwax.html.

*Primary Examiner* — Sanza McClendon
(74) *Attorney, Agent, or Firm* — John J. Piskorski

(57) ABSTRACT

Hot melt compositions include non-aromatic cyclic (alkyl) acrylates and low acid number waxes. Upon application of actinic radiation, the hot melt compositions cure to form resists. They may be stripped from substrates with high alkaline strippers. The hot melt compositions may be used in the manufacture of printed circuit boards and photovoltaic devices.

4 Claims, No Drawings

(56) References Cited

U.S. PATENT DOCUMENTS

| | | |
|---|---|---|
| 7,166,402 B2 | 1/2007 | Veregin et al. |
| 7,192,457 B2 | 3/2007 | Murphy et al. |
| 7,384,568 B2 | 6/2008 | Wong et al. |
| 7,427,360 B2 | 9/2008 | Hopper et al. |
| 7,915,326 B2 | 3/2011 | Oguchi et al. |
| 8,252,506 B2 | 8/2012 | Cheetham et al. |
| 8,404,797 B2 | 3/2013 | Kawabe et al. |
| 2005/0287459 A1 | 12/2005 | Moffat et al. |
| 2006/0019077 A1 | 1/2006 | Hopper et al. |
| 2006/0047017 A1 | 3/2006 | Miyamoto et al. |
| 2006/0219133 A1 | 10/2006 | Sakamoto et al. |
| 2006/0219976 A1 | 10/2006 | Yamamiya et al. |
| 2007/0120922 A1 | 5/2007 | Belelie et al. |
| 2010/0013690 A1 | 1/2010 | Kuramochi et al. |
| 2010/0313788 A1 | 12/2010 | Drappel et al. |
| 2011/0148979 A1 | 6/2011 | Breton et al. |
| 2011/0152397 A1 | 6/2011 | Breton et al. |
| 2011/0262643 A1* | 10/2011 | Chopra ............... C09D 11/101 427/256 |

FOREIGN PATENT DOCUMENTS

| | | |
|---|---|---|
| WO | 02/053659 | 7/2002 |
| WO | 2004/026977 | 4/2004 |
| WO | 2004/028244 | 4/2004 |
| WO | 2004/106437 | 12/2004 |
| WO | 2007/119966 | 10/2007 |
| WO | 2008/021780 | 2/2008 |

\* cited by examiner

HOT MELT COMPOSITIONS WITH IMPROVED ETCH RESISTANCE

CONTINUITY

This is a divisional of application Ser. No. 13/971,537, filed Aug. 20, 2013, now U.S. Pat. No. 9,453,139.

FIELD OF THE INVENTION

The present invention is directed to hot melt compositions with improved etch resistance. More specifically, the present invention is directed to hot melt compositions with improved etch resistance containing non-aromatic cyclic (alkyl)acrylates and low acid number waxes.

BACKGROUND OF THE INVENTION

Hot melts are in solid phase at ambient temperatures, but exist in liquid phase at elevated operating temperatures in inkjet printing devices. At the inkjet operating temperatures droplets of liquid hot melt are ejected from the printing device and, when the droplets contact a surface of a printing material, they harden to form a predetermined pattern of droplets.

Hot melts have been employed in direct and transfer printing processes. Hot melts are typically cast into solid sticks and placed into an inkjet printing device. The temperature of the inkjet device is raised to an operating temperature where a liquid phase with selective fluid properties is formed. The hot melt is then held as a liquid at the operating temperature in a reservoir and printhead of the inkjet printer. The hot melt in its liquid phase may then be applied in a predetermined pattern onto a substrate. While hot melts have been used for some time in the conventional printing industry, the electronics industry is beginning to appreciate the potential use of such compounds to address the problems in the manufacture of electronic devices, such as in the manufacture of printed circuit boards (PCBs).

PCBs are typically made by complex processes such as with dry film negative photoresist processes involving six or more stages. Firstly, a dielectric substrate is laminated or coated with copper and the copper surface is then overlaid with a photoresist layer. A photo-tool is prepared which is a negative of the required electrically conductive circuitry of the printed circuit. The photo-tool is placed directly over the photoresist layer to polymerise and harden in those areas exposed to the UV light to produce a latent image of the required electrically conductive circuitry in the photoresist layer. The photoresist layer is then developed to remove the unexposed area of the photoresist. This chemical treatment is typically mildly alkaline where the photoresist layer contains free carboxylic groups.

The exposed copper is then selectively removed by chemical etching from those areas not protected by the photoresist layers. Finally, the exposed areas of the photoresist layer are removed chemically, for example using stronger aqueous alkali where the photolayer contains free carboxylic acid groups.

Although the process is widely used in the manufacture of PCBs it is tedious, expensive and wasteful of materials since the photoresist layer is made separately and applied over the total area of the copper/dielectric substrate laminate. Furthermore, the photo-tool containing the negative image of the desired electrically conductive circuitry is often distanced from the photo-tool layer such that diffraction of UV light irradiation occurs and leads to development and polymerization in areas of the photoresist not directly beneath the UV transparent areas of the photo-tool. Such problems must be taken into consideration when preparing photo-tools and may reduce the density and definition of the electrically conductive circuitry. Furthermore, the chemical structure of the photoresist must be carefully controlled since its removal both before and after exposure to UV light depends on the alkaline treatment. The density and integrity of the intended electrically conductive circuitry can be seriously compromised if either the unexposed photoresist is incompletely removed or if some of the exposed and polymerized photoresist is removed prior to chemically etching the copper. Accordingly, there exists significant attraction in applying photoresist or similar materials to specific areas of a copper/dielectric laminate using inkjet printing technology.

When inkjet printing is done using hot melt inks, the image or negative image is made digitally available direct from a computer, the number of process steps is halved, and the need for differential removal of the hot melt ink using mild aqueous alkali is avoided. Also, since there is no photo-tool which is distanced from the hot melt ink layer, there is a potential for improved definition and density of the circuitry. There also exists the cost savings in terms of hot melt ink material since the hot melt is only applied to those areas to be protected from chemical etching.

Substantially complete removal of hot melt materials is highly desirable. If hot melt residue is left on a substrate after removal, the residue may compromise further processing of the substrate. For example, hot melt inks may be deposited on a PCB to function as a negative mask for forming a circuit pattern. Sections of the substrate which are not covered by the mask are etched away using an etchant and the hot melt ink is then stripped. Subsequent steps typically involve one or more metal plating processes. Any residue remaining on the PCB after stripping may compromise metal plating resulting in a defective electronic device.

A major problem which often arises during formation of the circuitry is undercutting. This results in defective and inefficient PCBs. This problem is common when the circuits are formed using an etching method in combination with a mask. Upon application of the etch to the selectively masked substrate the etch may not only remove portions of the substrate not covered by the mask but by capillary action seep under the mask at the interface of the mask and the substrate causing portions of the substrate covered by the mask to be undesirably etched away. This results in circuitry having irregular widths which results in irregular and non-uniform current flow. In addition, such undercutting may form tributaries which adjoin adjacent current lines resulting in electrical shorts.

Ammoniacal etchant which is a mixture of ammonia and ammonium chloride, is a high alkaline etching solution typically used in the outer layer circuitry fabrication of PCBs as opposed to inner layers. Most alkaline etch baths are designed to work in a pH range of 7.8 to 8.9; however, higher pH is preferred for a faster etch rate to reduce the contact time between the etchant and the PCB thus to reduce the opportunity of spreading of the etchant to other parts of the PCB and attacking the other parts which are sensitive to high pH values. Although most inkjet printable inner layer etch resist formulations are effective at a low pH range, inner layers are very sensitive to high pH values of 8.5 or greater. Etching at high pH can cause chemical attack of some etch resists resulting in an unacceptable large undercut or lifting off of layers from the substrate caused by a combination of capillary undercut of the etching chemistry and etchants penetrating into the resist causing swelling and adhesion failure.

As the industry seeks to manufacture electrical devices using thinner and more delicate circuitry and at the same time increase the plurality of circuits to increase electrical out-put, the foregoing problems become compounded by difficulty of working with smaller and more delicate materials. Accordingly, there is a need for a method which substantially reduces or eliminates the problem of undercutting in the formation of electrical circuits and improves stripping of the resists from substrates.

SUMMARY OF THE INVENTION

Hot melt compositions include one or more non-aromatic cyclic (alkyl)acrylates, one or more waxes with an acid number of 0 to 30 mg KOH/g and one or more radical initiators.

Methods include:
a) providing a hot melt ink composition including one or more non-aromatic cyclic (alkyl)acrylates, one or more waxes with an acid number of 0 to 30 mg KOH/g and one or more radical initiators;
b) selectively depositing the hot melt composition on a substrate;
c) applying actinic radiation to the hot melt composition to cure the hot melt composition;
d) etching sections of the substrate not covered with the cured hot melt composition; and
e) removing the cured hot melt composition from the substrate with a base having a pH of 11 or greater to form a patterned article.

Methods also include:
a) providing a hot melt composition including one or more non-aromatic cyclic (alkyl)acrylates, one or more waxes with an acid number of 0 to 30 mg KOH/g and one or more radical initiators;
b) selectively depositing the hot melt composition on a substrate;
c) applying actinic radiation to the hot melt composition to cure the hot melt composition;
d) plating metal onto the sections of the substrate not covered with the cured hot melt composition; and
e) removing the cured hot melt composition with a base having a pH of 11 or greater to form a patterned article.

The hot melt compositions have acid and alkaline resistance up to a pH of less than 11 in contrast to many conventional resists. They adhere on a variety of surfaces with reduced undercut. In addition, the resists may be rapidly stripped at pH values of 11 or greater. The hot melt compositions may be applied to substrates by conventional inkjet apparatus as well as by conventional screen printing methods and by conventional spray apparatus which may have nano- to macro-deposition capability. The compositions are used as resists. They may be used as a plating resist or as an etch resist.

The hot melt compositions may also be used as an alkaline etch resist for inner layers of multi-layer substrates. Ammoniacal etchants are very common etchants used in etching copper in outer layers during PCB manufacturing. Ammoniacal etchants are preferred over acidic $CuCl_2$ etchants. Ammoniacal etchants have the advantage of being able to etch exposed copper from the surface of PCBs while not removing tin/lead solder plating that covers the protected portions of copper circuitry. In addition, acid $CuCl_2$ etch onsite recovery often involves use of chlorine gas, a significant health and environmental hazard. An advantage of ammoniacal etchants for both outer and inner layers eliminates the need for maintaining two etch modules with different etch chemistries for both inner and outer layer circuitry in PCB manufacturing.

The compositions and methods may be used in the manufacture of components of electronic devices, such as PCBs and lead frames, optoelectronic devices, photovoltaic devices, in the metal finishing of parts and precision tooling. They have good image definition and low flow due to their phase change nature.

DETAILED DESCRIPTION OF THE INVENTION

As used throughout this specification, the following abbreviations have the following meanings, unless the context indicates otherwise: ° C.=degrees Centigrade; g=grams; L=liters; mL=milliliters; cm=centimeters; µ=µm=microns; dm=decimeters; m=meters; mJ=milliJoules; mN=milliNewtons; W=Watts=Amps×Volts; $A/dm^2$=amps per decimeter squared; DI=deionized; wt %=percent by weight; cP=centipoise; UV=ultraviolet; IR=infrared; rpm=revolutions per minute; dpi=drops per inch; 2.54 cm=1 inch; PCB=printed circuit board or printed wiring board; KOH=potassium hydroxide; ASTM=American Standard Testing Method; kV=kilovolts; and psi=pounds/inch=0.06805 atmospheres=$1.01325 \times 10^6$ dynes/$cm^2$ "Actinic radiation" means electromagnetic radiation that can produce photochemical reactions. "Viscosity"=internal fluid friction or the ratio of the shear stress to the rate of shear of a fluid. "Acid value or acid number"=grams of potassium hydroxide required to neutralize 1 gm of free acid, and to measure the free acid present in a substance. "Moiety" means a specific group of atoms in a molecule. All percentages are by weight, unless otherwise noted. All numerical ranges are inclusive and combinable in any order, except where it is logical that such numerical ranges are constrained to add up to 100%.

The combination of one or more non-aromatic cyclic (alkyl)acrylate monomers, one or more waxes having an acid number of 0 to 30 mg KOH/g and one or more radical initiators provides compositions which are hot melts and when cured may be used as a resist, such as an etch resist or a plating resist, and at the same time are strippable from substrates using base strippers at pH values of 11 or greater such that substantially all of the cured hot melt composition is removed from the substrate. The cured hot melts are resistant to acid etchants, such as hydrofluoric acid, nitric acid, sulfuric acid, phosphoric acid, organic acids, such as carboxylic acids and mixtures thereof, and to industrial etches such as cupric chloride ($CuCl_2$) and ferric chloride ($FeCl_3$) and alkaline etchants such as ammoniacal etchants, ammonium hydroxide, ammonium chloride and ammonium sulfate. The compositions are readily stripped from substrates using base strippers such as organic amines which include alkanolamines, alkali metal hydroxides, which include potassium, sodium and mixtures thereof, and alkali carbonates and bicarbonates at pH values of 11 or greater. The net acid number of the compositions ranges from 0-20 mg KOH/g. Conventional methods known in the art may be used as sources of actinic radiation to cure the compositions, such as actinic radiation in the IR, UV and visible ranges as well as X-rays and microwaves as well as other forms of actinic radiation.

The compositions are free of organic solvents as well as water. This means that no additional solvents or water are included in the compositions and only trace amounts of solvents or water may be present as impurities or as by-products in the manufacture of various components used to make the compositions. Preferably, the compositions are 100 wt % solids. They are low flowing, thus they form printed dots with aspect ratios (height to width) in the range of 0.05 to 0.25, or such as from 0.08 to 0.18. They also form images having good image definition.

Viscosities of the compositions are such that they may be used with many conventional inkjet apparatus. Typically, the viscosities of the compositions range from 4 cPs to 80 cPs from 40° C. to 150° C. Preferably the viscosities range from 8 cPs to 12 cPs from 85° C. to 90° C. Viscosity may be measured by conventional methods but is typically measured using a Brookfield viscometer with a rotating spindle, for example a number 18 spindle or a CP-42 spindle.

Non-aromatic cyclic (alkyl)acrylates include, but are not limited to monocyclic, bicyclic, tricyclic and tetracyclic alicyclic (alkyl)acrylates having a bridged skeleton such as adamantine, norbanane, tricyclodecane and tetracyclododecane, and alicyclic hydrocarbon groups without a bridged skeleton which include but are not limited to cycloalkane such as cyclobutane, cyclopentane, cyclohexane, cycloheptane and cyclooctane. Cyclic structures also include non-aromatic heterocyclic groups such as furan. Such non-aromatic cyclic (alkyl)acrylates have low acid numbers. In general, the acid numbers range from 0 to 1 KOH/g. $T_g$ values may range from 80° C. and greater, preferably from 80° C. to 250° C.

Non-aromatic cyclic (alkyl)acrylate monomers may have the following general structure:

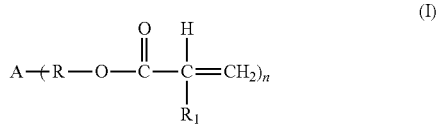

(I)

where R is $-(C(R')_2)_m-$ or $-(CH_2)_p-O-(CH_2)_q-$ and a carbon or oxygen of R is covalently bonded to a carbon of a ring structure of A, preferably R is $-(C(R')2)_m-$, R' is independently hydrogen or $(C_1-C_3)$alkyl, preferably R' is hydrogen or methyl, $R_1$ is hydrogen or linear or branched $(C_1-C_4)$alkyl, preferably $R_1$ is hydrogen or methyl, n is an integer of 1 or 2 where when n is 1 the monomer of structure (I) is a monoacrylate and when n is 2 the monomer structure (I) is a diacrylate, m is an integer of 0 to 2, preferably m is an integer of 0 to 1, more preferably m is 1, when m is 0, the oxygen is covalently bonded to a carbon of a ring structure of A, p is an integer of 0 to 6, preferably p is 0 to 2 and when p is 0, the oxygen is covalently bonded to a carbon of a ring structure of A and q is an integer of 1 to 20, preferably q is 1 to 10, more preferably 1 to 5; and A is a substituted or unsubstituted monocyclic, bicyclic, tricyclic, tetracyclic carbon ring structure having a bridged skeleton, cyclobutane, cyclopentane, cyclohexane, cycloheptane, cyclooctane or a non-aromatic heterocyclic ring such as furan. Preferably A is the bridged carbon skeleton structures adamantine, norbonane, tricyclodecane and tetracyclododecane, more preferably A is norbonane, tricyclodecane and tetracyclododecane, most preferably A is norbonane and tricyclodecane. Substituent groups on the rings of A include, but are not limited to hydroxyl, oxy (=O), aldo (—CHO), cyano (—CN), halogen such as chlorine, bromine, fluorine and iodine, linear or branched halo$(C_1-C_4)$alkyl, linear or branched hydroxy$(C_1-C_4)$alkyl, linear or branched cyano$(C_1-C_4)$alkyl, linear or branched aldo$(C_1-C_4)$alkyl, linear, branched or cyclic alkyl groups having 1-10 carbon atoms, preferably linear or branched $(C_1-C_4)$alkyl such as methyl, ethyl, n-propyl, i-propyl, n-butyl, 2-methylpropyl, 1-methylpropyl and t-butyl.

Examples of such monomers include the following:

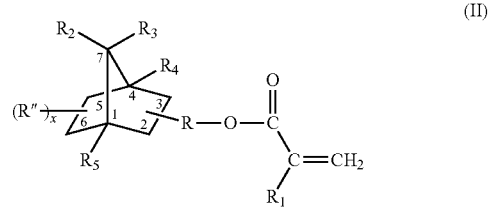

(II)

where R and $R_1$ are defined as above and when the moiety $-R-O-C(O)-C(R_1)=CH_2$ is joined to either carbon 2 or carbon 3 of the ring hydrogen completes the valence of carbons 2 and 3; $R_2$, $R_3$, $R_4$ and $R_5$ are independently hydrogen, halogen, hydroxyl, aldo, cyano, linear or branched halo$(C_1-C_4)$alkyl, linear or branched hydroxy$(C_1-C_4)$alkyl, linear or branched cyano$(C_1-C_4)$alkyl, linear or branched aldo$(C_1-C_4)$alkyl, or linear, branched or cyclic alkyl groups having 1-10 carbon atoms, preferably $R_2$, $R_3$, $R_4$ and $R_5$ are independently hydrogen, hydroxyl, halogen or linear or branched $(C_1-C_4)$alkyl such as methyl, ethyl, n-propyl, i-propyl, n-butyl, 2-methylpropyl, 1-methylpropyl and t-butyl, more preferably $R_2$, $R_3$, $R_4$ and $R_5$ are independently hydrogen or linear or branched $(C_1-C_4)$alkyl such as methyl, ethyl, n-propyl, i-propyl, n-butyl, 2-methylpropyl, 1-methylpropyl and t-butyl; R" is the moiety $-R-O-C(O)-C(R_1)=CH_2$ of structure (II) above, hydroxyl, linear or branched hydroxyl$(C_1-C_4)$alky, aldo, aldo$(C_1-C_4)$alkyl, oxy, or linear or branched $(C_1-C_4)$alkyl, preferably R" is the moiety $-R-O-C(O)-C(R_1)=CH_2$, hydroxyl, linear or branched hydroxyl$(C_1-C_4)$alkyl or linear or branched $(C_1-C_4)$alkyl, x is 0 or 1, when x is 1 and R" is joined to either carbon 5 or carbon 6 by a covalent bond by its carbon or oxygen, hydrogen is bonded to the carbons to complete the valence and when x is 0, hydrogen is joined to carbons 5 and 6 to complete the valence, preferably x is 0.

Examples of monomers also include those having the following general structure:

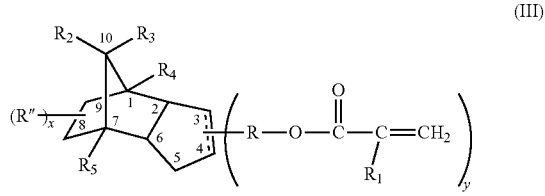

(III)

where R, $R_1$, $R_2$, $R_3$, $R_4$, $R_5$ and R" are defined as above and when the moiety $-R-O-C(O)-C(R_1)=CH_2$ is joined to either carbon 3 or carbon 4 of the cyclopentane ring, hydrogen completes the valence of carbons 3 and 4 and when R" is joined to either carbon 8 or carbon 9 by a covalent bond, hydrogen completes the valence of carbons 8 and 9, preferably there is no optional double bond joining carbons 3 and 4 of the cyclopentane ring, x is 0 or 1, preferably x is 1 and preferably R" is the moiety —R—O—

C(O)—C(R$_1$)=CH$_2$, y is 0 or 1 with the proviso that when y is 0, R" is the moiety —R—O—C(O)—C(R$_1$)=CH$_2$, preferably y is 1.

Examples of monomers further include those having the following general structure:

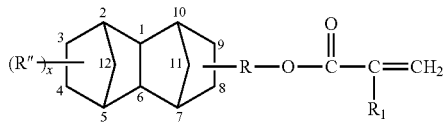

(IV)

where R, R$_1$, R" and x are as defined above and when the moiety —R—O—C(O)—C(R$_1$)=CH$_2$ is joined to either carbon 8 or carbon 9 of the ring by a covalent bond, hydrogen completes the valence of carbons 8 and 9 and when R" is joined to either carbon 3 or carbon 4 by a covalent bond, hydrogen completes the valence of carbons 3 and 4, preferably R" is hydroxyl, linear or branched hydroxy(C$_1$-C$_4$)alkyl, oxy, aldo, cyano, cyano(C$_1$-C$_4$)alkyl or the moiety —R—O—C(O)—C(R$_1$)=CH$_2$, more preferably R" is hydroxyl, linear or branched hydroxyl(C$_1$-C$_4$) alkyl or oxy.

Examples of additional monomers include those have the following general structure:

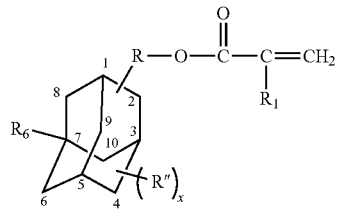

(V)

where R, R$_1$, R" and x are defined as above and R$_6$ is hydrogen, hydroxyl or cyano, preferably R$_6$ is hydrogen or hydroxyl, and when the moiety —R—O—C(O)—C(R$_1$)=CH$_2$ is joined to either carbon 1 or carbon 2 of the ring by a covalent bond, hydrogen completes the valence of carbons 1 and 2 and when R" is joined to either carbon 3 or carbon 4, hydrogen completes the valence of carbons 3 and 4, preferably R" is oxy, hydroxyl or cyano, more preferably R" is oxy or hydroxyl and x is 1.

Other examples of monomers include those having the following structure:

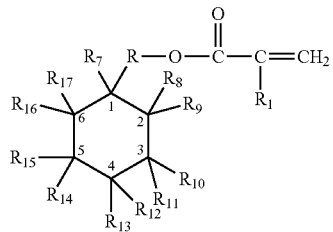

(VI)

where R and R$_1$ are as defined above and R$_7$-R$_{17}$ are independently hydrogen, hydroxyl, halogen, linear or branched, substituted or unsubstituted (C$_1$-C$_{20}$)alkyl. Substituents include, but are not limited to hydroxyl, amine, halogen, (alky)acrylate, and linear or branched (C$_1$-C$_4$) alkoxy.

The non-aromatic cyclic (alkyl)acrylates may be made by methods known in the art and literature or may be obtained commercially from various sources. Examples of commercially available cyclic (alkyl)acrylates are tricyclodecane acrylate, isobornyl cyclohexyl acrylate, isobornyl cyclohexyl methacrylate, 3,3,5 trimethylcyclohexyl methacrylate, dicyclopentadienyl methacrylate, tetrahydrofurfuryl acrylate, tetrahydrofurfuryl methacrylate, cyclic trimethylpropane dimethylacrylate, cyclohexane dimethanol dimethacrylate, cyclic trimethylopropane formal acrylate, 2-norbornyl acrylate and SR 833S tricyclodecane dimethanol diacrylate. Many of the commercially available cyclic (alkyl)acrylates may be obtained from Cray Valley Inc., Akros BV or Cognis Inc. The non-aromatic cyclic (alkyl)acrylates are included in the hot melt compositions in amounts of 30 wt % and greater, preferably 30 wt % to 70 wt % of the composition. More preferably the non-aromatic cyclic (alkyl)acrylates are included in the hot melt compositions in amounts of 40 wt % to 60 wt %.

Waxes which have an acid number of 0 to 30 mg KOH/g include, but are not limited to waxes of plant origin such as candelilla wax and carnuba wax, petroleum waxes such as paraffin wax or microcrystalline wax, mineral waxes such as esterified montan waxes, ozokerite, bees wax and ceresin waxes, synthesized hydrocarbon waxes such as Fischer-Tropsch wax, hydrogenated waxes such as hardened castor oil and fatty acid esters. Such waxes typically contain mainly hydrocarbons or esterified waxes. In general such waxes may include 40%-80% by weight hydrocarbons or esterified waxes or mixtures thereof. Such waxes are included in the hot melt compositions in amounts of 5 wt % to 30 wt %, preferably from 5 wt % to 25 wt %. Commercially available examples of such waxes are SP-75 from Strahl & Pitsch, Inc. (candelilla wax), SP1026 and SP319 also from Strahl & Pitsch, Inc. (ceresin waxes), Paraffin Wax 1250 from The International Group, Inc. and LICOWAX® E Flake and LICOLUB® WM 31 both from Clariant (esterified montan waxes).

Radical initiators may be initiators including optional synergists which are typically used in the trade to initiate polymerization of (alkyl)acrylate functional monomers. The initiator and the synergist, when present may be activated by actinic radiation. Sources of actinic radiation include, but are not limited to, mercury lamps, xenon lamps, carbon arc lamps, tungsten filament lamps, light emitting diodes (LEDs), lasers, electron beam and sunlight. UV radiation is typically used, such as from medium pressure mercury lamps. Typically, the radical initiator is a photoinitiator activated by UV light.

Examples of radical initiators and synergists are anthraquinone, substituted anthraquinones such as alkyl and halogen substituted anthraquinones such as 2-tertiary butyl anthraquinone, 1-chloroanthraquinone, p-chloroanthraquinone, 2-methylanthraquinone, 2-ethylanthraquinone, octamethyl anthraquinone and 2-amylanthraquinone, optionally substituted polynuclear quinones such as 1,4-naphthaquinone, 9,10-phenanthraquinone, 1,2-benzanthraquinone, 2,3-benzanthraquinone, 2-methyl-1,4-napththoquinone, 2,3-dichloronaphthaquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthaanthraquinone, 1,2,3,4-tetrahydrobenzanthracene-7,2-dione, acetophenones such as acetaphenone, 2,2-dimethoxy-2-phenyl acetophenone, 2,2-diethoxy-2-phenyl acetophenone, 1,1-dichloro acetophenone, 1-hydroxy cyclohexyl phenylketone and 2-methyl-1-(4-methylthio)phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzylbenzoin methyl ether, benzoin isopropyl ether and benzoin isobutyl ether; azo compounds such as azobisisovaleronitrile; benzophenones such as benzophenone, methylbenzophenone, 4,4-dichlorobenzophenone, 4,4-bis-diethyl amino benzophenone, Michler's ketone and xanthone, and mixtures thereof. Examples of commercial initiators and synergists are Speedcure™ ITX, EHA and 3040, Irgacure™ 184, 369, 907 and 1850, Daracure™ 1173. Speedcure™, Irgacure™ and Daracure™ are registered trademarks of Lambson Plc and Ciba GmbH, respectively.

Radical initiators are included in sufficient amounts to enable curing of the compositions upon exposure to actinic radiation. Typically, such radical initiators are included in amounts of 0.1 wt % to 10 wt % of the composition, preferably from 1 wt % to 5 wt % of the composition.

Optionally the hot melt compositions can include one or more waxes having acid numbers of 100 mg KOH/g or greater. Typically such waxes have an acid content of 110 mg KOH/g to 250 mg KOH/g. Such waxes are 60% and greater acid functionalized, preferably 70% and greater. Such waxes are included in the hot melt compositions such that the weight ratio of the waxes having the acid numbers of 0 to 30 mg KOH/g to the waxes having acid numbers of 100 mg KOH/g or greater is from 1:1 to 5:1, preferably from 1:1 to 2:1. Preferably the hot melt compositions include one or more waxes with an acid number of 100 mg KOH/g or greater. Such waxes include, but are not limited to LICOWAX® S, manufactured by Clariant GmbH (Germany), with an acid value of 127 to 160 mg KOH/g, LICOWAX® SW with acid values of 115 to 135 mg KOH/g, LICOWAX® UL with an acid value of 100 to 115 mg KOH/g and LICOWAX® X101 with acid values of 130 to 150 mg KOH/g. Such waxes are high acid containing montan waxes or n-octacosanoic acid, $CH_3$—$(CH_2)_{26}$—COOH, 100% acid functionalized. Carboxylic acid-terminated polyethylene waxes such as myristic acid with acid numbers of 244-248 mg KOH/g, hexadecanoic and palmitic acid with acid numbers of 215-233 mg KOH/g and octadecanoic and stearic acid with acid numbers of 205-210 mg KOH/g may be included.

Optionally the hot melt ink compositions can include one or more non-cyclic (alkyl)acrylates free of acid groups. Examples of such acrylate functional monomers free from acid groups are those which are commercially available under the SARTOMER™, ACTILANE™ and PHOTOMER™ trademarks, such as SARTOMER™ 306 tripropylene glycol diacrylate, ACTILANE™ 430 trimethylol propane ethoxylate triacrylate, ACTILANE™ 251 a trifunctional acrylate oligomer, PHOTOMER™ 4072 trimethylol propane propoxylate triacrylate, PHOTOMER™ 5429 a polyester tetra-acrylate and PHOTOMER™ 4039 a phenol ethoxylate monoacrylate. SARTOMER™, ACTILANE™ and PHOTOMER™ are trademarks of Cray Valley Inc., Akros BV and Cognis Inc., respectively. Other examples of monomers are lauryl acrylate, isodecylacrylate, isooctyl acrylate, butyl acrylate, 2-hydroxy ethyl acrylate, 2-hydroxy propylacrylate, 2-ethyl hexyl acrylate, 1,6-hexanediol diacrylate, neopentyl glycol diacrylate, diethylene glycol diacrylate, butanediol diacrylate, trimethylolpropane triacrylate, pentaerythritol triacrylate, 1,3-butyleneglycol diacrylate, 1,4-butylene glycol diacrylate, triethylene glycol diacrylate, pentaerythritol tetra acrylate, tripropylene glycol diacrylate and phenoxyethyl acrylate. Such acrylate functional monomers free of acid functionality are included in the compositions in amounts of 1 wt % to 25 wt %, preferably from 5 wt % to 20 wt %.

Optionally, one or more colorants may be included in the resist compositions. Such colorants include pigments and dyes including fluorescing dyes. Colorants may be included in the compositions in conventional amounts to provide a desired color contrast. Suitable pigments include, but are not limited to, titanium dioxide, Prussian blue, cadmium sulfide, iron oxides, vermillion, ultramarine and the chrome pigments, including chromates, molybdates and mixed chromates and sulfates of lead, zinc, barium, calcium and mixtures and modifications thereof which are commercially available as greenish-yellow to red pigments under the names primrose, lemon, middle orange, scarlet and red chromes.

Suitable dyes include, but are not limited to, azo dyes, metal complex dyes, Naphthol dyes, anthraquinone dyes, indigo dyes, carbonium dyes, quinoneimine dyes, xanthene dyes, cyanine dyes, quinoline dyes, nitro dyes, nitroso dyes, benzoquinone dyes, naphthoquinone dyes, penoline dyes, pthalicyanine dyes and leuco dyes. Examples of fluorescent dyes are xanthenes such as rhodamine and fluorescein, bimanes, coumarins such as umbelliferone, aromatic amines such as dansyl, squarate dyes, benzofurans, cyanines, merocyanines, rare earth chelates and carbozoles.

Additional optional conventional additives include, but are not limited to, surfactants such as non-ionic, cationic, anionic and amphoteric, slip modifiers, thioxtropic agents, foaming agents, anti-foaming agents, plasticizers, thickeners, binders, antioxidants, photoinitiator stabilizers, gloss agents, fungicides, bactericides, organic and inorganic filler particles, leveling agents, opacifiers, antistatic agents and metal adhesion agents. Such optional additives may be included in conventional amounts.

The hot melt resist compositions may be prepared by any suitable method known in the art. The waxes, (alkyl)acrylate monomers and radical initiators which are included in the compositions typically are solids or semi-solids at room temperatures. They may be combined together in any order. They may be heated to soften or liquefy them such that they may be readily mixed together or with any additional components. Components may be combined in any order in a conventional mixing or homogenizing apparatus. Temperatures of above 25° C. to 150° C. typically are employed to mix the components. After the components are uniformly mixed the mixture may be cooled to 25° C. or below to form a solid hot melt composition.

Typically the hot melt compositions are applied by inkjet. Inkjet apparatus may digitally store information in its memory for a selective resist design to be applied to a substrate. Examples of suitable computer programs are standard CAD (computer aided design) programs for generation of tooling data. Workers may readily modify the selective deposition of the compositions by changing the program digitally stored in the ink jet apparatus. Additionally, registration problems also may be readily addressed. The inkjet apparatus may be programmed to perceive potential incorrect alignment between substrates, such as in the manufacture of multi-layer PCBs. When the apparatus senses misregistration between boards, the program modifies the inkjet application of the resist mask pattern to avoid or correct misregistration between adjacent boards. The ability to re-design the pattern from board to board reduces the potential for misregistration between the boards, and eliminates the costly and inefficient task of preparing multiple fixed phototools. Accordingly, efficiency of selective deposition of the resist and image formation is improved over many conventional methods.

There are two major categories of inkjet printing, "Drop-On-Demand" inkjet and "Continuous" inkjet. Using Drop-On-Demand inkjet technology the resist composition is stored in a reservoir and delivered to a nozzle in the print head of the printer. A means exists to force a single drop of composition out of the nozzle and onto a substrate. Typically this is a piezo electric actuation of a diaphragm within a chamber, which "pumps" the droplets out of the nozzles, or a localized heating of the fluid to increase the pressure within the chamber, thus forcing a droplet to eject.

In "continuous" inkjet printing, a continuous stream of hot melt resist composition is delivered to a nozzle in the print head of the printer. Prior to passing out of the nozzle, the pressurized composition stream proceeds through a ceramic crystal subjected to an electric current. This current causes a piezoelectric vibration equal to the frequency of AC (alternating current) electric current. This vibration, in turn, generates droplets of the composition from the unbroken stream. The composition breaks up into a continuous series of drops, which are equally spaced and of equal size. Surrounding the jet at the point where the drops separate from the liquid stream in a charge electrode a voltage is applied between the charge electrode and the drop stream. When the drops break off from the stream, each drop carries a charge proportional to the applied voltage at the instant at which it breaks off. By varying the charge electrode voltages at the same rate as drops are produced every drop may be charged to a predetermined level. The drop stream continues its flight and passes between two deflector plates, which are maintained at a constant potential such as +/−0.1 kV to +/−5 kV, or such as +/−1 kV to +/−3 kV. In the presence of this field, a drop is deflected towards one of the plates by an amount proportional to the charge carried. Drops, which are uncharged, are undeflected and collected into a gutter to be recycled to the ink nozzle. Drops which are charged and hence deflected impinge on a radiant energy sensitive material traveling at right angles to the direction of drop deflection. By varying the charge on individual drops, a desired pattern can be applied. Drop sizes may range from 30 μm to 100 μm, or such as from 40 μm to 80 μm, or such as from 50 μm to 70 μm in diameter.

The inkjet processes are adaptable to computer control for high-speed application of continuously variable data. Inkjet printing methods may be divided into three general categories: high pressure (10 psi and greater), low pressure (less than 10 psi) and vacuum techniques. All are known in the art or described in the literature and can be employed in the application of the resist compositions to substrates.

In addition to application by inkjet, the hot melt resist compositions may be applied by using screen printing and by spray apparatus having nano- to macro-deposition capability. An example of one type of spray apparatus which may be used is the M$^3$D® which is available from Optomec®.

The hot melt resist compositions may be used as etch resists or in the alternative as plating resists. In general, the resist composition is selectively deposited on a substrate followed by curing the resist composition with actinic radiation. After curing, the uncovered sections of the substrate may be etched to a desired depth or to remove sections of the substrate surface to expose underlying layers to form a pattern on the substrate. The etchant does not remove the resist from the substrate during etching, thus the resist composition functions as an etch resist. The etch resist is then stripped from the substrate leaving a patterned substrate for further processing by conventional methods known in the art. In the alternative the uncovered sections of the substrate may be plated with a metal to form a pattern on the substrate, thus the resist functions as a plating resist. The plating resist is then stripped from the substrate leaving a substrate with a metal pattern for further processing by conventional methods known in the art. Stripping is done with a base at pH 11 or higher and at temperatures from 0° C. to 100° C., typically from 40° C. to 60° C. Preferably stripping is done at pH of 11 to 13.

As a variant on the above, the substrate may be selectively coated with the resist on both sides and exposed to actinic radiation. Etching and plating may then be done on both sides of the substrate simultaneously.

Etching may be done by methods known in the art appropriate to the material of which the substrate is composed. Typically, etching is done with acids, such as hydrofluoric acid, nitric acid, phosphoric acid, hydrochloric acid, organic acids, such as carboxylic acids and mixtures thereof and alkaline etchants such as ammoniacal etchants, ammonium hydroxide, ammonium chloride and ammonium sulfate. Industrial etchants such as cupric chloride ($CuCl_2$) and ferric chloride ($FeCl_3$) may be used. Preferably ammoniacal etchants are used when etching multilayer PCBs. Such etches are well known in the art or may be obtained from the literature.

Etching is typically done at temperatures of 20° C. to 100° C., more typically from 25° C. to 60° C. Etching includes spraying or dipping the resist coated substrate with the etchant in either a vertical or horizontal position. Typically, spraying is done when the substrate is in the horizontal position. This allows for quicker removal of the etchant. The speed of etching may be accelerated by agitating the etchant, for example, using sonic agitation or oscillating sprays. After the substrate has been treated with the etchant it is typically rinsed with water to remove traces of the etchant.

One or more metal layers may be deposited in the pattern formed on the substrate. Metals may be deposited electrolessly, electrolytically, by immersion or light induced plating. Conventional electroless, electrolytic, and immersion baths and methods may be used to deposit metal or metal alloy layers. Many such baths are commercially available or described in the literature. Metals include, but are not limited to, noble and non-noble metals and their alloys. Examples of suitable noble metals are gold, silver, platinum, palladium and their alloys. Examples of suitable non-noble metals are copper, nickel, cobalt, bismuth, zinc, indium, tin and their alloys.

Substrates include, but are not limited to, PCBs, semiconductor wafers, such as for photovoltaics and solar cells, and components for optoelectronic devices. In general, in the manufacture of PCBs, the resist composition is selectively deposited on a copper clad board and cured using actinic radiation. The sections of the copper clad board not coated with the resist are etched away. The resist is stripped from the board leaving a circuit pattern on the board. In another aspect, the resist is selectively deposited on a board made conductive with a metal seed layer using conventional processes and cured using actinic radiation. Sections of the board which are not coated with the resist are plated with a metal or metal alloy. The cured resist is then stripped from the board leaving a metal pattern on the board.

In general, in the manufacture of a photovoltaic or solar cell, the hot melt resist is selectively deposited on a front side antireflection layer of a doped semiconductor wafer. The antireflection layer may be silicon, silicon nitride $Si_3N_4$, silicon oxide $SiO_x$ or combinations thereof. Typically, the antireflection layer is $Si_3N_4$. The semiconductor may be monocrystalline or polycrystalline. The resist is then cured with actinic radiation and sections of the antireflection layer are etched away exposing the emitter layer of the doped semiconductor (n+ or n++ doped). The cured resist is then stripped and the sections of the emitter layer which are not covered by the antireflective layer are plated with a metal or metal alloy to form a pattern of current tracks and bus bars.

In another aspect the resist may be selectively deposited on a back side of a doped semiconductor wafer which is coated with a metal, such as aluminum, copper, nickel, silver and gold. The resist is cured using actinic radiation. Sections of metal which are not covered by the resist are etched away to form a pattern of current tracks for an electrode.

The hot melt compositions have acid and alkaline resistance from pH 1 to a pH of less than 11 in contrast to many conventional resists. They adhere on a variety of surfaces with reduced undercut. In addition, the resists may be rapidly stripped at pH values of 11 or greater.

The hot melt compositions may be applied to substrates by conventional inkjet apparatus as well as by conventional screen printing methods and by conventional spray apparatus which may have nano- to macro-deposition capability. The compositions are used as resists. They may be used as a plating resist or as an etch resist. The hot melt compositions also may be used as alkaline etch resists for inner and outer layers of multi-layer substrates. The compositions and methods may be used in the manufacture of components of electronic devices, such as PCBs and lead frames, optoelectronic devices, photovoltaic devices, in the metal finishing of parts and precision tooling. They have good image definition and low flow due to their phase change nature.

The following examples are intended to further illustrate the invention but are not intended to limit its scope.

EXAMPLES 1-4

The following inkjet etch resist compositions were prepared:

| Formulation | 1 | 2 | 3 | 4 |
|---|---|---|---|---|
| Monomers | | | | |
| Isobornyl acrylate | 48 wt % | | | |
| Dicyclopentadienyl methacrylate | | 50 wt % | | 50 wt % |
| Trimethylolpropane triacrylate | | | | 17 wt % |
| Polybutadiene diacrylate | | 10 wt % | | |
| Polybutadiene dimethacrylate | 12 wt % | | | |
| Tricyclodecane dimethanol diacrylate | | | 60 wt % | |
| Aliphatic urethane acrylate[1] | | | | 13 wt % |
| Plasticizers | | | | |
| Partially hydrogenated rosin resin[2] | 20 wt % | | | |
| Hydrogenated rosin resin[3] | | 20 wt % | | |
| Liquid rosin[4] | | | 20% | |
| Photoinitiators | | | | |
| Isopropyl thixanthone | 5 wt % | 5 wt % | 2% | 2.5 wt % |
| Hydroxycylohexyll phenyl ketone | 5 wt % | 5 wt % | 3% | 2.5 wt % |
| Waxes | | | | |
| Ceresin wax | 10 wt % | | | 7.5 wt % |
| Candelilla wax | | | 10 wt % | |
| Esterified Montan wax | | 10 wt % | | |
| Montan wax | | | | 7.5 wt % |
| Myristic acid | 10% | | | |
| Palmitic acid | | 10 wt % | | |
| Stearic acid | | | 5 wt % | |

[1]EBECRYL ® 8309 Acrylic Ester from Cytec Industries
[2]STAYBELITE ® A typical composition and properties: abietic acid <3 wt %, dehydroabietic acid 6-10 wt %, dihydroabietic acid 60-80 wt %, tetrahydroabietic acid 5-15 wt %, other resin acids and neutrals 10-15 wt %, softening point, Ring & Ball, ° C. = 65-69, acid number 158-160
[3]Hercolyn Floral AX-E from Pinova solutions inc.
[4]Hercolyn D-Methyl Hydrogenated Rosinate from Pinova solutions inc.

All the formulations were prepared by the same method. The monomers, waxes, plasticizers and the photoinitiators were blended together using a conventional laboratory blending apparatus at room temperature. The formulations were 100% solids. The mixtures were then heated in a conventional convection oven within a temperature range of 85° C. to 90° C. The heated resists were then filtered through a conventional laboratory 1.5μ metal filter while still within the temperature range of 85° C. to 90° C. The viscosity of each ink was measured using a Brookfield viscometer with thermosel attachment with a CP-42 spindle. The viscosities of the resists ranged from 8 cPs to 12 cPs. The net acid numbers for the four inkjet resists were calculated to range from 0-20 mg KOH/g.

EXAMPLE 5

Etch Resist for PCB Application

The resist compositions from examples 1-4 were selectively ink jetted from a piezoelectric drop-on-demand print head (Spectra™ SE-128) onto four separate copper clad FR4/glass epoxy panels at a thickness of 15 μm to 30 μm. The temperature during inkjetting was from 85° C. to 95° C. After the resist compositions were selectively applied to their respective panels, the compositions were exposed to UV light varying from 150-1000 mJ/cm² using a Fusion D lamp running at 120 W/cm. All the resists cured.

The hardness of each cured resist is tested using the ASTM D3363-05 pencil hardness test, 5H being the hardest and 1H being the softest. The hardness value for each cured resist was measured to be 4H.

Each panel was then passed through a conventional etching module containing a commercial ammonia etchant which was a mixture of 5-15% of each of $NH_4OH$ and $NH_4Cl$ at pH 8.9, 52° C. for 5 min. The copper was etched to a depth of 105 μm. The resist compositions withstood the etching action of the ammoniacal etching solution. There was no visual observable lifting of panel layers. After etching was completed the panels were rinsed with water.

Each panel was then dipped in a bath of aqueous stripping solution containing 15% tetramethyl ammonium hydroxide and 5% ammonia solution. The pH ranged from 11 to 12 at 45° C. for one minute to strip the resist from the panels leaving a copper circuit pattern on them. The pH decreased from 12 to 11 as the resist was stripped from the substrate and went into the alkaline solution. Using an optical microscope at 5000 power an undercut of 10%-12% was observed as opposed to 20%-25% of conventional methods. The undercut was measured microscopically by using the conventional method of checking the line width of the resist before etching and the line width of the copper line after etching.

EXAMPLE 6

Etch Resist for Semiconductor Applications

Solar cells having mono-crystalline or poly-crystalline silicon wafers, a p/n junction and coated with a silicon nitride anti-reflective layer on the front side were provided. Each of the four resist compositions in Examples 1-4 were selectively coated on the anti-reflective layers by inkjet. Each resist was applied to one of the two types of silicon wafers. The resists were then exposed to UV light of 150-1000 mJ/cm$^2$ to cure the resists.

Each solar cell was then immersed in a 20% solution of hydrofluoric acid at 30° C., pH=1 for 5 minutes to etch away the uncoated silicon nitride and expose the n+ doped surface of the silicon. The solar cells were then rinsed with tap water for 2 minutes and air dried. An optical microscope was used to observe the cured resist on each solar cell. There was no observable loss of cured hot melt on either solar cell. The cured hot melt appeared to have resisted the acid etch. Each wafer was then dipped in a bath of aqueous stripping solution containing 15% tetramethyl ammonium hydroxide and 5% ammonia solution at 45° C., for one minute to strip the resist from the solar cells leaving a silicon nitride pattern on the them. Using an optical microscope at 5000 power a 10%-12% undercut was observed as opposed to the typical conventional undercut of 15% or more.

EXAMPLE 7

Plating Resist for PCB Applications

The resist compositions from examples 1-4 were selectively jetted from a piezoelectric drop-on-demand print head (Spectra SE-128) onto four separate freshly copper plated acid test coupon panels at a thickness of 15 μm. The temperature during inkjetting varied from 85° C. to 90° C. After the resist compositions were selectively applied to their respective panels, the compositions were exposed to UV light varying from 150-1000 mJ/cm$^2$ using a Fusion D lamp running at 120 W/cm. All of the resists cured.

The hardness of each cured resist was tested using the ASTM D3363-05 pencil hardness test. The hardness value was 4H for each sample.

The samples were immersed in an ambient 10% sulfuric acid pre-dip for two minutes and plated in a RONASTAN™ EC Acid Tin plating bath at 23° C. at a current density of 12 A/dm$^2$ for 8 and 10 minute dwell times. Tin metal was deposited in sections not coated with the resists. Tin deposition was done until the tin deposit was 0.25 μm to 2 μm. The finished coupons were rinsed and air dried with compressed air.

Each panel was then dipped in a bath of aqueous stripping solution of 15% tetramethyl ammonium hydroxide and 5% ammonia at 45° C., for one minute to strip the resist from the panels leaving a copper circuit pattern underneath a tin plated layer.

EXAMPLE 8

Plating Resist for Semiconductor Applications

Solar cells having of mono-crystalline or poly-crystalline silicon wafers, a p/n junction and coated with a silicon nitride anti-reflective layer on the front side were provided. Each of the four resist compositions in Examples 1-4 were coated on the anti-reflective layer of the two types of silicon wafers. The resists were then cured by exposing the front of the solar cells to UV light at 150-1000 mJ/cm$^2$.

Each solar cell was then immersed in a 20% solution of hydrofluoric acid at 30° C., pH=1 for 5 minutes to etch away the uncoated silicon nitride and expose the n+ doped surface of the silicon. The solar cells were then rinsed with tap water for 2 minutes and air dried. An optical microscope was used to observe the cured hot melt on each solar cell. There was no observable loss of cured hot melt on either solar cell. The cured hot melt appeared to have resisted the acid etch.

Each solar cell was then immersed into a bath of ENLIGHT™ 620 Silver Electrolyte solution (available from Dow Electronic Materials). The solar cells were connected to a rectifier and the counter electrode was a soluble silver electrode. Light from a fluorescent/LED lamp 8-12 W was applied to the front side of each solar cell and a current density of 0.5 A/dm$^2$ was applied. The silver electrolyte was maintained at a temperature of 40° C. and silver plating was done for 15 minutes.

After plating was completed each solar cell was placed under the optical microscope. All of the exposed n+ doped silicon sections were plated with silver. The cured hot melt appeared intact. Each wafer is then dipped in a bath of aqueous stripping solution of 15% tetramethyl ammonium hydroxide and 5% ammonia solution at 45° C., for one minute to strip the resist from the solar cells leaving an etched pattern. The undercut for the mono-crystalline solar cell was 12% and the undercut for the multi-crystalline was 10%. This was below the typical undercut for wafers of 15% or more.

EXAMPLE 9 (Comparative)

FR4/glass-epoxy copper coated substrates were selectively coated with hot melt compositions as in the Table above except the cyclic acyrlates were replaced with one of the following low volatile acrylates: propoxylated neopentyl glycol diacrylate for isobornyl acrylate, dipropylene glycol diacrylate and tripropylene glycol diacrylate for dicyclopentadienyl methacrylate, and propoxyethyl methacrylate for tricyclodecane dimethanol diacrylate. The amounts of each replacement acrylate were the amounts of the cyclic acrylate used in the formulations of the Table. A plurality of selectively applied lines using the inkjet printer was jetted onto each substrate. The resists were applied to the substrate at nozzle temperatures of around 85° C.-90° C. The resists were cured using UV light at 150-1000 mJ/cm$^2$.

Each substrate was then sprayed with 15% ammonia and 5% cupric chloride etching solution at pH 8.9 at 52° C. Each substrate was exposed to the etching solution for 1 minute then the substrates were rinsed with DI water for two minutes. Examination of each substrate with an optical microscope indicated that substantially all of the cured resists were removed and the portions of the copper covered by the resists were also etched. This indicated that resists which excluded the alicyclic acrylates had decreased alkaline resistance.

What is claimed is:

1. A method comprising:
   a. providing a hot melt composition comprising one or more non-aromatic cyclic (alkyl)acrylates, one or more waxes chosen from candelilla waxes, esterified montan waxes, ozokerite waxes, ceresin waxes, synthesized hydrocarbon waxes and hydrogenated waxes comprising an acid number of 0 to 30 mg KOH/g, wherein the one or more waxes are in amounts of 5 wt % to 30 wt % and one or more radical initiators;
   b. selectively depositing the hot melt composition on a substrate;
   c. applying actinic radiation to the hot melts composition to cure the composition;
   d. etching sections of the substrate not covered with the cured hot melt composition; and
   e. removing the cured hot melt composition from the substrate with a base comprising a pH of 11 or greater to form a patterned article.

2. The method of claim 1, wherein the hot melt composition further comprises one or more waxes comprising an acid number of 100 mg KOH/g or greater wherein a weight ratio of the one or more waxes comprising an acid number of 0 to 30 mg KOH/g to the one or more waxes comprising an acid number of 100 mg KOH/g is 1:1 to 5:1.

3. The method of claim 1, wherein the hot melt composition further comprises one or more non-cyclic (alkyl) acrylates free of acid groups.

4. A method comprising:
   a. providing a hot melt composition comprising one or more non-aromatic cyclic (alkyl)acrylates, one or more waxes chosen from candelilla waxes, esterified montan waxes, ozokerite waxes, ceresin waxes, synthesized hydrocarbon waxes and hydrogenated waxes comprising an acid number of 0 to 30 mg KOH/g, wherein the one or more waxes are in amounts of 5 wt % to 30 wt % and one or more radical initiators;
   b. selectively depositing the hot melt composition on a substrate;
   c. applying actinic radiation to the hot melt composition to cure the hot melt composition;
   d. plating metal onto the sections of the substrate not covered with the cured hot melt composition; and
   e. removing the cured hot melt composition with a base comprising a pH of 11 or greater to form a patterned article.

* * * * *